United States Patent
Krishnamurthy et al.

(10) Patent No.: US 9,438,219 B2
(45) Date of Patent: Sep. 6, 2016

(54) HYBRID DIGITAL PULSE WIDTH MODULATION (PWM) BASED ON PHASES OF A SYSTEM CLOCK

(75) Inventors: Harish K. Krishnamurthy, Hillsboro, OR (US); Annabelle Pratt, Littleton, CO (US); Mark L. Neidengard, Beaverton, OR (US); George E. Matthew, Hillsboro, OR (US); James Alexander Darnes, Oxfordshire (GB)

(73) Assignee: Intel Corporation, Santa Clara, CA (US)

( * ) Notice: Subject to any disclaimer, the term of this patent is extended or adjusted under 35 U.S.C. 154(b) by 156 days.

(21) Appl. No.: 14/350,547

(22) PCT Filed: Dec. 22, 2011

(86) PCT No.: PCT/US2011/066746
§ 371 (c)(1),
(2), (4) Date: Apr. 8, 2014

(87) PCT Pub. No.: WO2013/095487
PCT Pub. Date: Jun. 27, 2013

(65) Prior Publication Data
US 2014/0266136 A1  Sep. 18, 2014

(51) Int. Cl.
*H03K 7/08* (2006.01)
*H02M 3/157* (2006.01)
*H02M 3/155* (2006.01)

(52) U.S. Cl.
CPC ............. *H03K 7/08* (2013.01); *H02M 3/155* (2013.01); *H02M 3/157* (2013.01)

(58) Field of Classification Search
CPC ...... H02M 3/155; H02M 3/157; H03K 7/08; H03L 7/081
USPC .................................................. 323/272, 283
See application file for complete search history.

(56) References Cited

U.S. PATENT DOCUMENTS 7,622,904 B2 * 11/2009 Sutardja ................ H02M 1/088
323/282
7,973,580 B2 7/2011 Nakamura et al.
(Continued)

FOREIGN PATENT DOCUMENTS

WO  2013095487 A1  6/2013

OTHER PUBLICATIONS

Office Action Received for Chinese Application No. 201220721290.5; mailed on Apr. 18, 2013.
(Continued)

*Primary Examiner* — Nguyen Tran
*Assistant Examiner* — Kyle J Moody
(74) *Attorney, Agent, or Firm* — Garrett IP, LLC

(57) ABSTRACT

Pulse width modulation (PWM) based on selectable phases of a system clock may be implemented with respect to leading-edge-modulation (LEM), trailing-edge-modulation (TEM), and/or dual-edge-modulation. An initial pulse may be generated based on a duty command, synchronous with the system clock, and may be registered with a D flip-flop under control of a selected phase of the system clock. Alternatively, a target count may be derived from the duty command, and an edge of the PWM pulse may be initiated when a count of the selected phase equals the target count. The pulse edge may be registered by a D flip-flop to a SR flip-flop under control of the selected phase. The phases of the system clock may be shared amongst multiple systems to generate multiple PWM signals. A system may include a DLL and digital logic, which may consist essentially of combinational logic and registers.

16 Claims, 13 Drawing Sheets

(56) References Cited

U.S. PATENT DOCUMENTS

| | | |
|---|---|---|
| 2005/0168205 A1 | 8/2005 | Dwarakanath et al. |
| 2008/0204160 A1 | 8/2008 | Prodic et al. |
| 2008/0310200 A1 | 12/2008 | Maksimovic et al. |
| 2009/0174262 A1* | 7/2009 | Martin ............... H02M 3/157 307/82 |
| 2011/0141780 A1 | 6/2011 | O'Malley et al. |
| 2011/0221409 A1* | 9/2011 | Nakamura ............ G06F 1/08 323/272 |
| 2011/0267019 A1* | 11/2011 | Krishnamurthy ... H02M 3/1584 323/283 |
| 2012/0015686 A1* | 1/2012 | Krupnik ............... H04W 88/02 455/550.1 |
| 2012/0242314 A1* | 9/2012 | Namekawa ........... H02M 3/157 323/283 |

OTHER PUBLICATIONS

International Search Report and Written Opinion received for Patent Application No. PCT/US2011/066746, mailed on Sep. 25, 2012.
International Preliminary Report on Patentability and Written Opinion received for PCT Patent Application No. PCT/US2011/066746, mailed on Jul. 3, 2014, 9 pages.

* cited by examiner

HYBRID DIGITAL PULSE WIDTH MODULATION (PWM) BASED ON PHASES OF A SYSTEM CLOCK

BACKGROUND

Pulse width modulation (PWM) may be used to control a switching-based voltage regulator (VR) to transfer charge from a source to a voltage rail.

A conventional PWM controller may include a counter and a delay-locked loop (DLL), referred to herein as a hybrid PWM controller. A conventional hybrid PWM controller may count pulses of a system clock based on a duty cycle command, and generate an initial pulse synchronous with the system clock. A conventional hybrid PWM controller may provide the initial pulse to the DLL to generate multiple phase-shifted versions of the initial pulse. A conventional hybrid PWM controller may select a one of the phase-shifted versions of the pulse to set a set/reset (RS) flip-flop during a leading edge modulation (LEM) cycle, and may select another one of the phase shifted versions of the initial pulse to reset the RS flip-flop during a trailing edge modulation (TEM) cycle. The RS flip-flop outputs a resultant phase-shifted pulse as a PWM signal to control a switching-based VR.

Conventionally, a dedicated DLL is used for each PWM signal of multiple VRs, and for each phase of a multi-phase VR.

Moreover, in a conventional hybrid PWM controller, no clock domain is associated with either the leading or trailing edge of the phase-shifted pulse. Such a conventional hybrid PWM controller is thus asynchronous.

Specifically, the set (S) and reset (R) inputs to the SR flip-flop are generated by combinational logic and delayed through the DLL. Moreover, the S and R inputs may be delayed by different amounts, and thus may be asynchronous with respect to one another. These factors may lead to glitches on the inputs of the SR flip-flop, which may result in improper execution of the pulse. This may be exasperated at higher switching frequencies as DLL resolution becomes comparable to delays through the combinational logic and setup and hold times of the SR flip flop, which may lead to non-uniform and/or non-monotonic duty cycles, which may result in voltage fluctuations on the regulated voltage rail.

Manual modifications may be made to a conventional hybrid PWM controller and/or an associated VR to improve linear and monotonic operation across PVT variations. This may, however, involve relatively extensive verification and validation processes. Such a system may not be considered a readily-synthesizable design and may negate benefits of digital control.

BRIEF DESCRIPTION OF THE DRAWINGS/FIGURES

Figure 1:
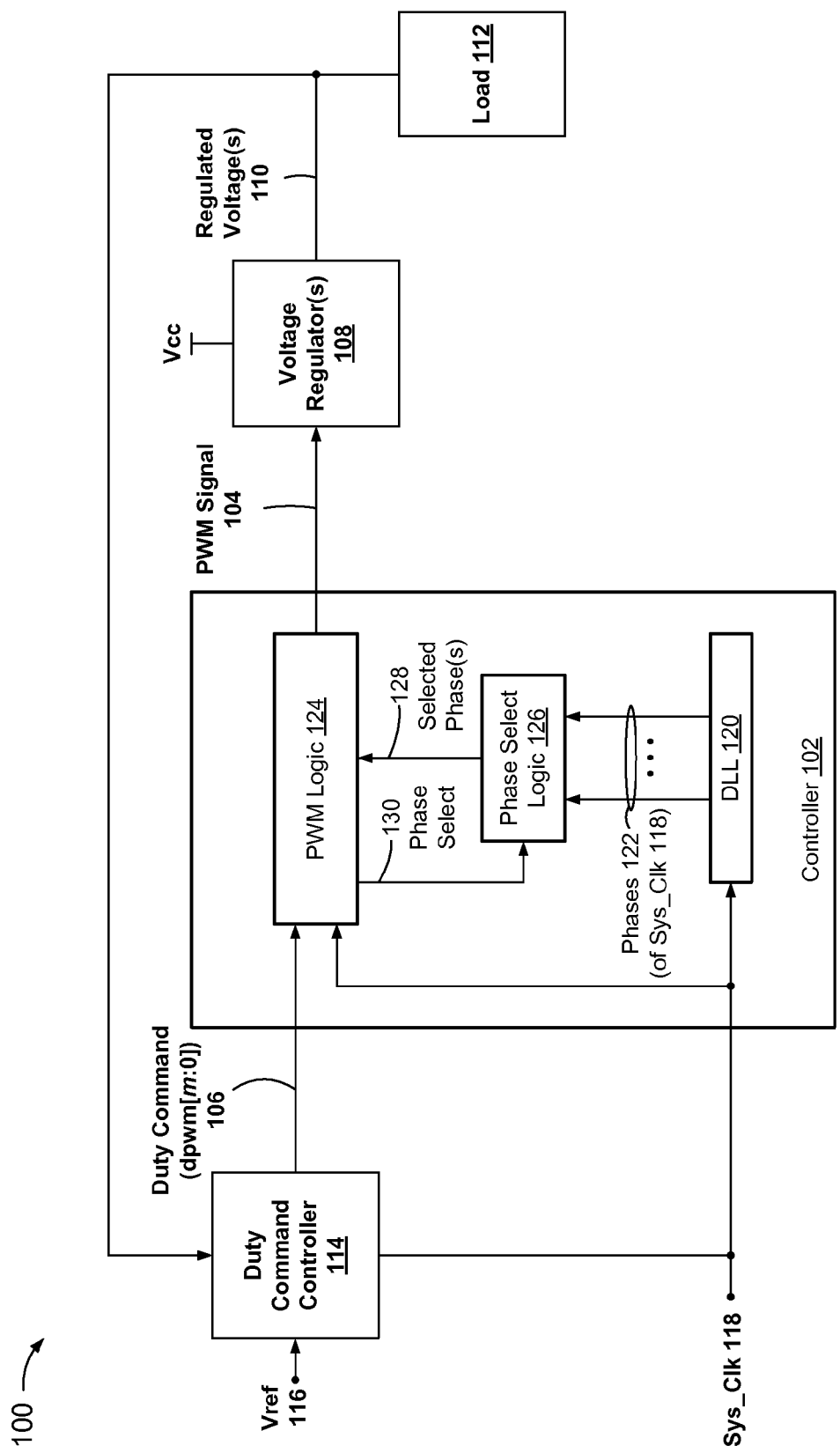
FIG. 1 is a block diagram of a system including a controller to generate a pulse width modulated (PWM) signal based on a duty cycle control word, or duty command 106, and selectable phases of a system clock.

In the drawings, the leftmost digit(s) of a reference number identifies the drawing in which the reference number first appears.

DETAILED DESCRIPTION

FIG. 1 is a block diagram of a system 100 including a controller 102 to generate a pulse width modulated (PWM) signal 104 based on a duty cycle control word, or duty command 106, and selectable phases 122 of a system clock, Sys_Clk 118.

System 100 may further include a voltage regulator (VR) VR 108 to provide a regulated voltage 110 to a load 112. VR 108 may include a switching-based VR to transfer charge from a source, Vcc, to a voltage rail of a load 112 during pulses of PWM signal 104. VR 108 may include, for example, one or more power field-effect-transistors (power FETs), which may be configured as a buck circuit.

System 100 may include a duty command controller 114 to generate duty command 106 to maintain regulated voltage 110 relative to a reference voltage 116. Duty command controller 114 may be implemented to generate duty command 106 based on Sys_Clk 118.

Controller 102 may be implemented to control PWM signal 104 with leading-edge modulation (LEM), in which a trailing edge of a pulse is fixed at a trailing edge of a window of time, and a leading edge of the pulse is adjusted to control the duty.

Controller 102 may be implemented to control PWM signal 104 with trailing-edge modulation (TEM), in which a leading edge of the pulse is fixed at a leading edge of a window of time, and a trailing edge of the pulse is adjusted to control the duty.

Controller 102 may be implemented to control PWM signal 104 with a combination of LEM and TEM, also referred to herein as symmetrical on-time modulation, and dual-edge modulation, in which a center of a pulse is fixed at a center of a window of time, and leading and trailing edges of the pulse are adjusted to control the duty.

Examples are provided herein with reference to dual-edge modulation. Methods and systems disclosed herein are not, however, limited to dual-edge modulation.

Figure 2:
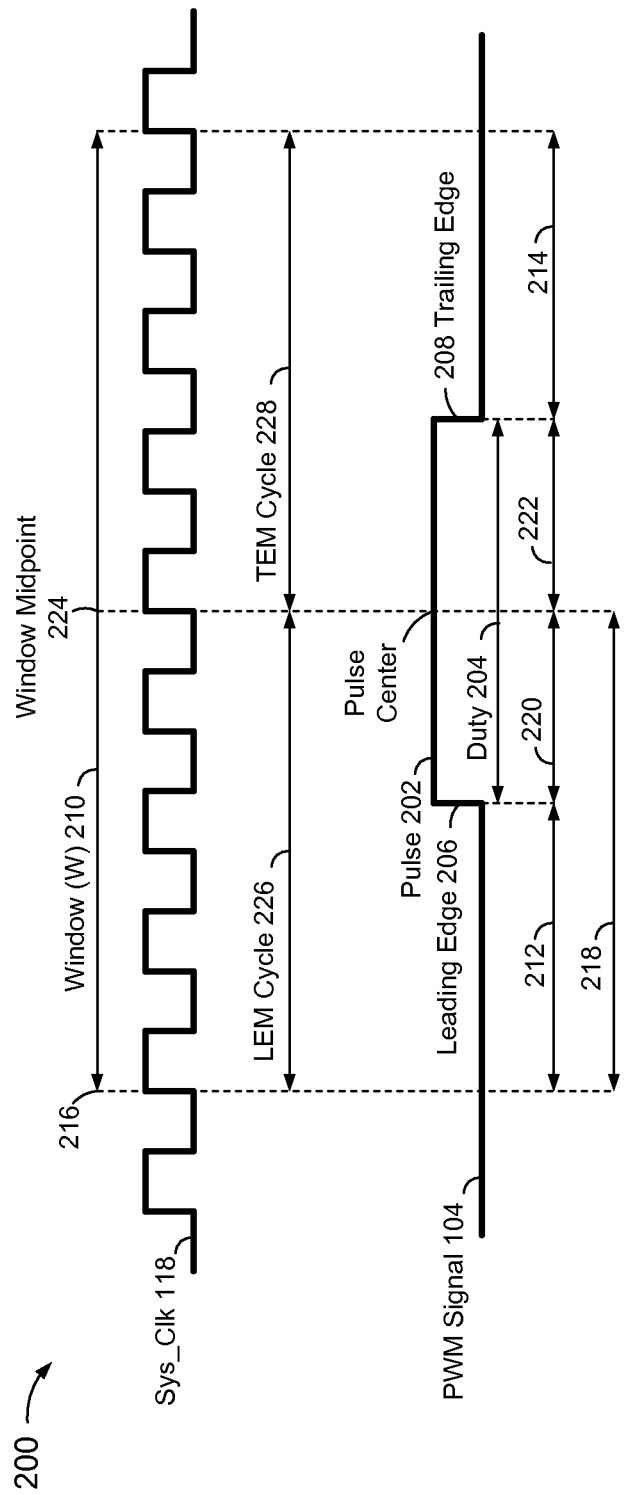
FIG. 2 is a timing diagram of a system clock and a PWM signal, including a pulse having a duty defined by leading and trailing pulse edges.

FIG. 2 is a timing diagram of Sys_Clk 118 and PWM signal 104, including a pulse 202 having a duty 204 defined by leading and trailing edges 206 and 208, respectively.

Duty command 106 in FIG. 1 may specify duty 204 relative to a window of time 210 in FIG. 2, where a maximum value of duty command 106 corresponds to a duration W of window 210.

In the example of FIG. 2, duration W corresponds to 8 cycles of Sys_Clk 118. Thus, a 4-bit duty command, dpwm [3:0], having $2^4=16$ possible states, may specify duty 204 to within ½ of a cycle of Sys_Clk 118. A 5-bit duty command, dpwm[4:0], having $2^5=32$ possible states, may specify duty 204 to within ¼ of a cycle of Sys_Clk 118.

In FIG. 1, controller 102 includes a delay locked loop DLL 120 to generate multiple phases 122 of Sys_Clk 118. DLL 120 may include $N=2^n$ delay cells, which may be denoted cells 0 through (N−1). DLL 402 may further include a controller to control the delay cells to provide equal amounts of delay relative to one another. The controller may be implemented to control the delay cells to provide a total delay equal to a period of Sys_Clk 118. For example, where N equals 4 (i.e., n=2), each delay cell may provide a delay equal to one quarter of a period of Sys_Clk 118.

The number of delay cells, N, may be selected as:

$$N=2^n=2^{(M)}/(\text{no. of clk cycles})=2^{(m+1)}/(\text{no. of clk cycles}); \quad \text{EQ. (1)}$$

where M is a number of bits of duty command 106, denoted 0 through m, where m is the most significant bit (MSB) position; and the number of clock cycles refers to the number of clock cycles of Sys_Clk 118 within window 210.

For a 5-bit duty command, dpwm[4:0], (i.e., M=5, and m=4), and an 8 cycle window 210:

$$N=2^n=2^{(5)}/(8)=32/8=4, \text{ and } n=2. \quad \text{EQ. (2)}$$

In accordance with dual-edge modulation, pulse 202 may be centered within window 210.

In FIG. 2, window 210 begins at time 216, and controller 102 may be implemented to assert leading edge 206 of pulse 202 after a delay 212. Delay 212 may be determined as:

$$\text{Delay } 212 = (\text{Duration } 218) - (\text{Duration } 220); \quad \text{EQ. (3)}$$

where, $$\text{Duration } 218 = \frac{W}{2} = \frac{2^M}{2} = 2^{M-1} = 2^m; \text{ and} \quad \text{EQ. (4)}$$

$$\text{Duration } 220 = \frac{\text{Duty}204}{2} = \frac{dpwm[m:0]}{2} = dpwm[m:1]. \quad \text{EQ. (5)}$$

EQ. (5) may be implemented with a right-shift of dpwm [m:0], to provide dpwm[m:1].

Controller 102 may be implemented to de-assert pulse 202 after a delay 222 following a midpoint 224 of window 210. Duration 222 may be determined as (Duty 204)/2, such as described above with respect to duration 220 and EQ. (5).

Where EQ. (5) results in a remainder, the remainder may be subtracted from leading edge 206 or added to trailing edge 208. While this may offset pulse 202 from window center 224, the offset may be relatively negligible.

Controller 102 further includes phase select logic 126 to selectively output one or more phases 122 of Sys_Clk 118 as selected phase(s) 128, based on one or more phase-select controls 130.

Controller 102 further includes PWM logic 124 to generate phase-select control(s) 130 based on duty command 106 and/or Sys_Clk 118, and to control generate PWM signal 104 based on duty command 106 and selected phase(s) 128.

PWM logic 124 may include combinational logic and registers, and may consist essentially of combinational logic and registers.

Phase select logic 126, or portions thereof, may be implemented within DLL 120 and/or PWM logic 124.

Controller 102 may include multiple instances of PWM logic 124 and corresponding phase select logic 126, each to generate a corresponding PWM signal based on a corresponding duty command and selected phases 122 of Sys_Clk 118. In other words, a single DLL 120 may be used to generate multiple PWM signals. Multiple PWM signals may be generated to control multiple VRs and/or multiple phases of a multi-phase VR, such as described below with reference to FIG. 3.

Figure 3:
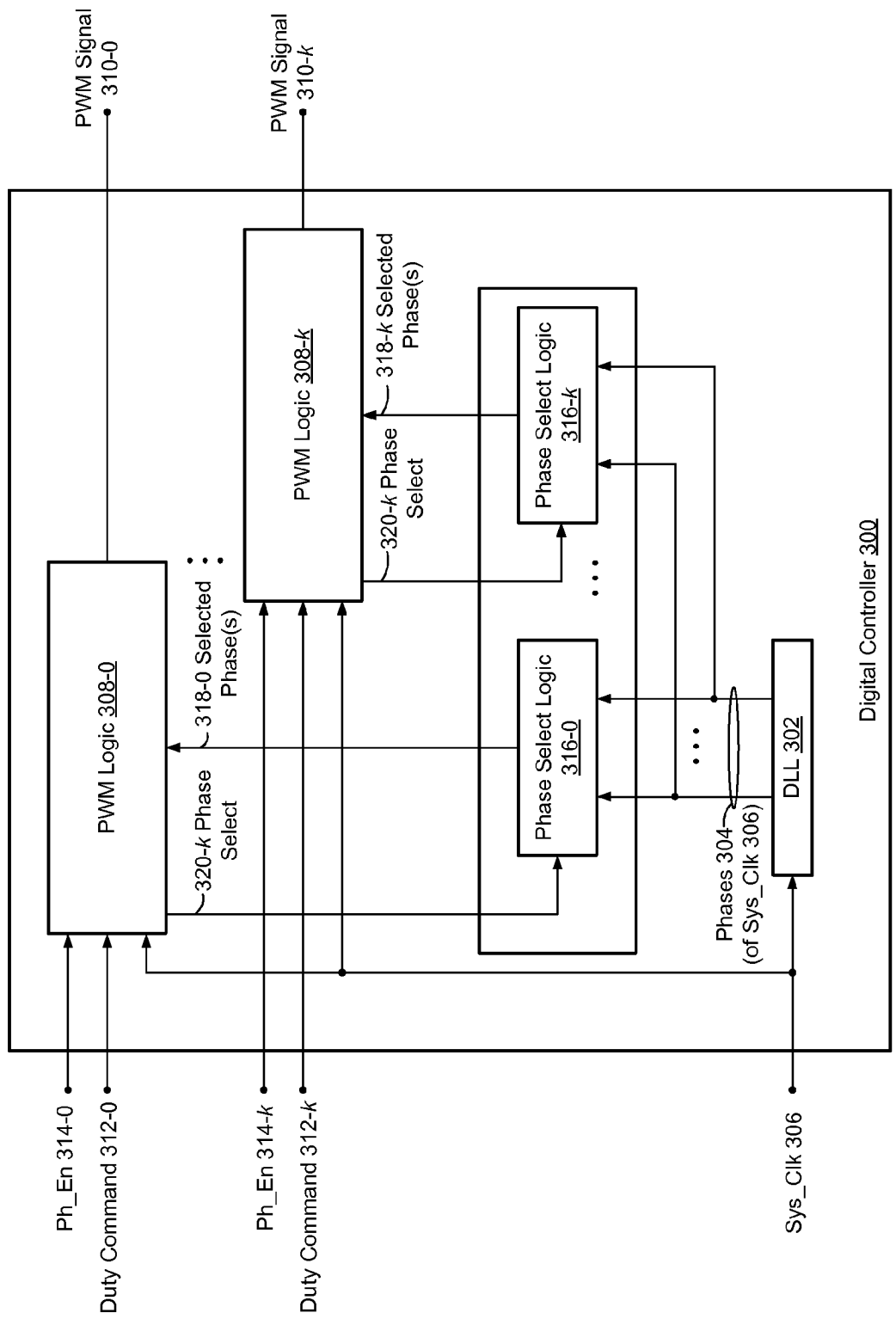
FIG. 3 is a block diagram of a controller, including multiple PWM logic blocks, each to generate a corresponding PWM signal based on shared phases of a system clock.

FIG. 3 is a block diagram of a controller 300, including PWM logic blocks 308-0 through 308-k, each to generate a corresponding PWM signal 310 based on shared phases of a system clock.

Controller 300 further includes a DLL 302 to provide multiple phases 304 of a system clock, Sys_Clk 306.

Controller 300 further includes multiple phase select logic blocks 316-0 through 316-k, each to provide a selected phase(s) 318 of Sys_Clk 306 to a corresponding one of PWM logic blocks 308, under control of a corresponding phase select control 320.

Where PWM signals 310-0 through 310-k are to control phases of a multi-phase VR, duty command controller 114 (FIG. 1) may be implemented to provide a phase enable control 314 to each of PWM logic blocks 308-0 through 308-k, to stagger operation of the PWM logic blocks.

Controller 102 in FIG. 1 and/or controller 300 in FIG. 3 may be implemented as described below with reference to one or more of FIGS. 4 through 10.

Figure 4:
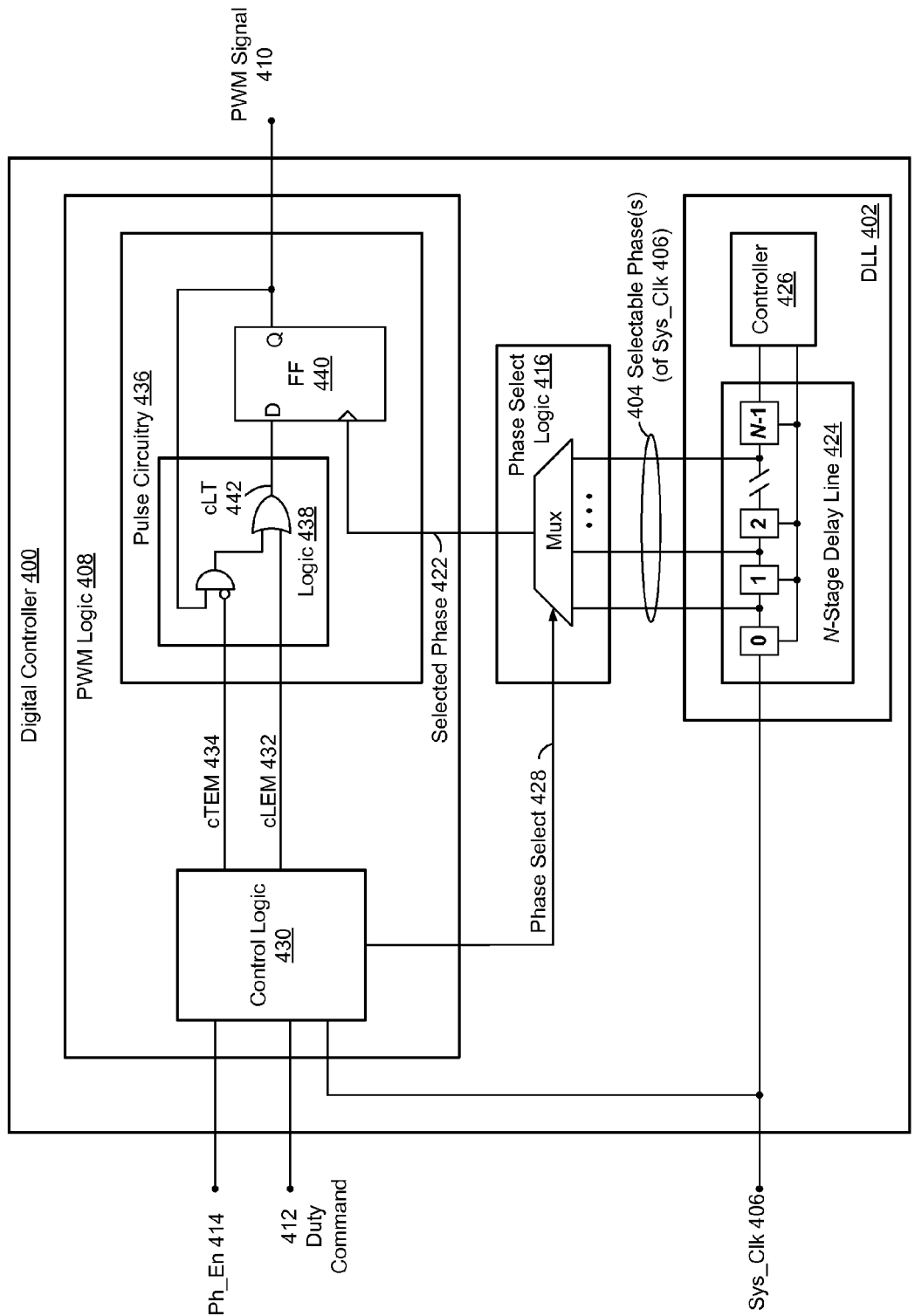
FIG. 4 is a block diagram of a controller to generate an initial pulse based on a delay term derived from a duty command, and re-time the pulse based on a selected phase of a system clock.

FIG. 4 is a block diagram of a controller 400 to generate an initial indication, such as a pulse, based on a delay term derived from a duty command, and to re-time the indication or pulse based on a selected phase of a system clock to generate an edge of a PWM pulse.

Controller 400 includes a DLL 402 to generate multiple phases 404 of a system clock Sys_Clk 406, and PWM logic 408 to generate a PWM signal 410 based on a duty command 412 and one or more selected phases 422.

PWM logic 408 includes control logic 430 to generate phase select control 428 and one or more of controls cLEM 432 and cTEM 434.

cLEM 432 may represent an approximate leading pulse edge based on a count of Sys_Clk 406 and most significant bits (MSBs) of duration 212 in FIG. 2.

cTEM 434 may represent an approximate trailing pulse edge based on a count of Sys_Clk 406 and MSBs of duration 222 in FIG. 2.

Control logic 430 may be implemented to generate a first phase select 428 during a LEM cycle 226 in FIG. 2, based on least significant bits (LSBs) of duration 212.

Control logic 430 may be further implemented to generate as second phase select 428 during a TEM cycle 228 in FIG. 2, based on LSBs of duration 222.

PWM logic 408 may include pulse circuitry 436 to generate a PWM pulse based on cLEM 432, cTEM 434, and selected phases 422.

Pulse circuitry 436 may include logic 438 to construct a pulse, illustrated here as cLT 442, from cLEM 432 and cTEM 434. Logic 438 may include OR logic to activate cLT 442 upon a leading edge of cLEM 432. Logic 438 may further include AND logic and a feedback path from PWM signal 410 to maintain cLT 42 active until a leading edge of cTEM.

Pulse circuitry 436 may further include a latch or register, illustrated here as a D flip-flop 440, to re-time a leading edge of cLT 442 during LEM cycle 226 based on selected phase 422, and to adjust a trailing edge of cLT 442 during TEM cycle 228 based on selected phase 422. D flip-flop 440 may register a leading edge of cLT 442 upon a leading edge of selected phase 422 during LEM cycle 226, effectively delaying the leading edge of cLT 442 based on the LSBs of duration 212 in FIG. 2. Similarly, D-FF 440 may register a trailing edge of cLT 442 upon a leading edge of selected phase 422 during TEM cycle 228, effectively delaying the trailing edge of pulse cLT 442 based on the LSBs of duration 222 in FIG. 2.

Controller 400, or portions thereof, may be implemented as described below with reference to FIG. 5 and/or FIG. 6.

Figure 5:
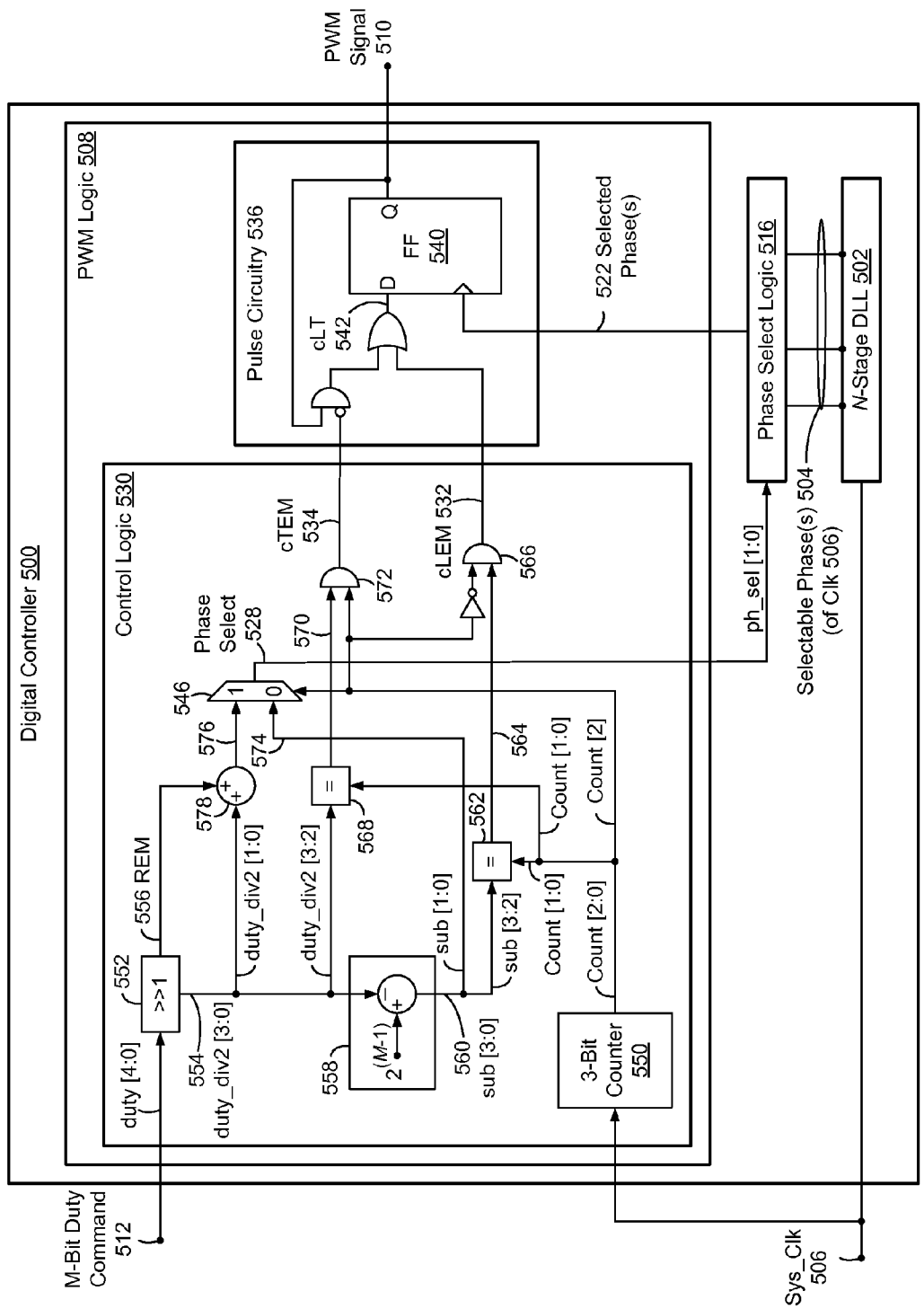
FIG. 5 is a block diagram of another controller, including a DLL to generate multiple phases of a system clock, and PWM logic to generate a PWM signal based on a duty command and one or more selected phases of the system clock.

FIG. 5 is a block diagram of a controller 500, including a DLL 502 to generate multiple phases 504 of a system clock Sys_Clk 506, and PWM logic 508 to generate a PWM signal 510 based on a duty command 512 and one or more selected phases 522 of Sys_Clk 506. Controller 500 further includes phase select logic 516 to provide the one or more selected phases 522 to PWM logic 508 under control of a phase select control 528, also illustrated here as ph_sel[1:0].

PWM logic 516 includes control logic 530 to generate controls cTEM, cLEM, and phase select 528, and pulse circuitry 536 to generate a PWM pulse based on cLEM 532, cTEM 534, and selected phase(s) 522.

Controller 500 is described below with reference to FIG. 6.

Figure 6:
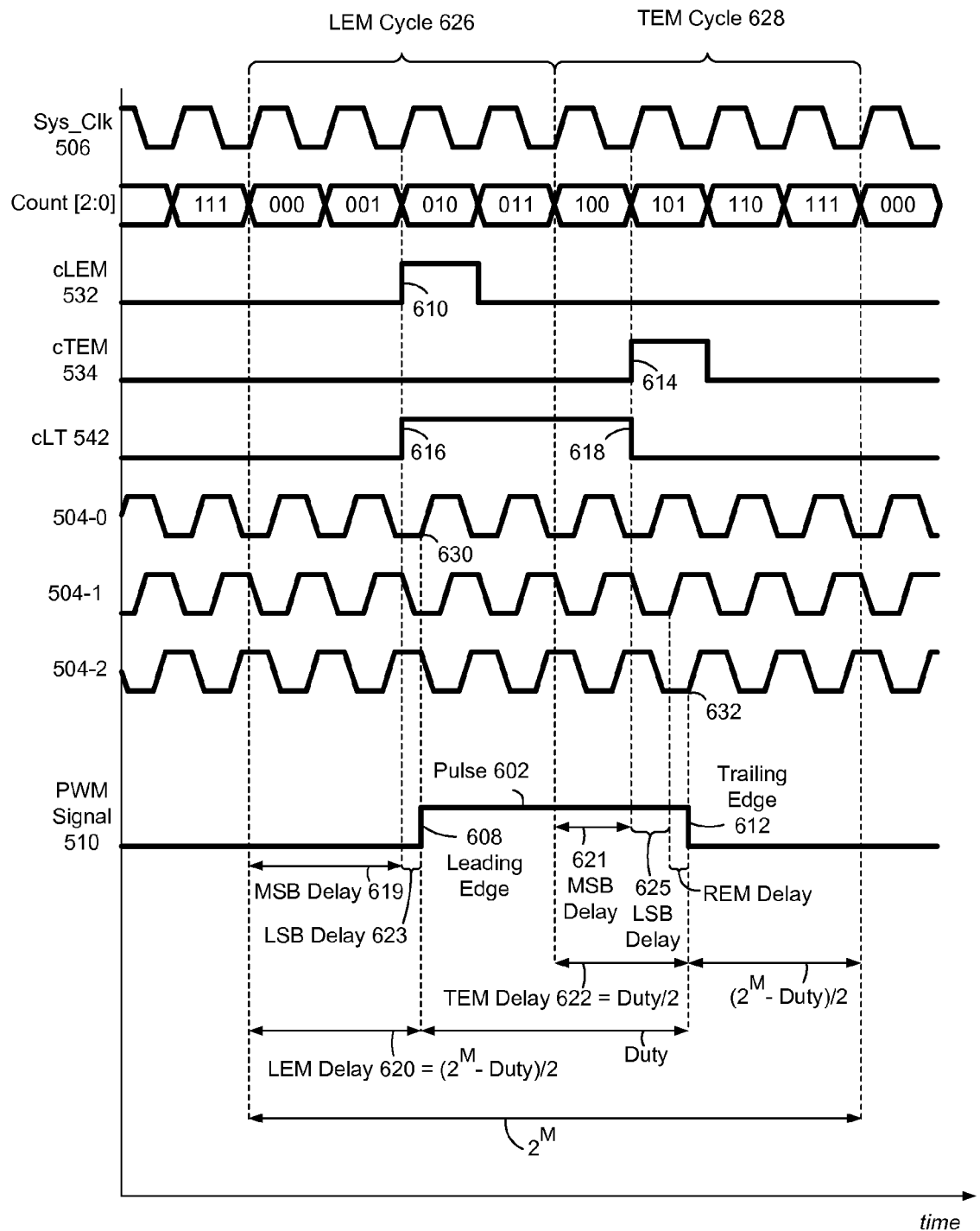
FIG. 6 is a timing diagram described below with reference to FIG. 5.

FIG. 6 is a timing diagram 600 of PWM signal 510, including a pulse 602 having a leading edge 608 and a trailing edge 612, and centered between a LEM cycle 626 and a TEM cycle 628.

LEM cycle 626 begins at a Count[2:0]=000, and TEM cycle 628 begins at Count[2:0]=100. Count[2:0], may correspond to a count of Sys_Clk 506.

Leading edge 608 occurs after a delay 620, illustrated here as including a MSB delay 619 and a LSB delay 623. MSB delay 619 may correspond to a leading edge 610 of cLEM 532, and LSB delay 621 may correspond to selected one of phases 504-0, 504-1, and 504-2.

Trailing edge 612 occurs after a delay 622, illustrated here as including a MSB delay 621, a LSB delay 625, and remainder or REM delay. MSB delay 621 may correspond to a leading edge 614 of cTEM 534, and a sum of LSB delay 625 and REM delay may correspond to a selected one of phases 504-0, 504-1, and 504-2.

Generation of pulse 602 is described below with reference to a 5-bit duty command 512, duty[4:0]=01101. Timing diagram 600 is not, however, limited to the example of FIG. 5, or a 5-bit duty command.

In FIG. 5, control logic 530 includes a 3-bit counter 550 to increment a count, Count[2:0], based on Sys_Clk 506.

Logic to derive delay terms from duty command 512 is now described.

Control logic 530 includes shift logic 552 to right-shift duty[4:0], which is equivalent to (duty[4:0]/2). Shift logic 552 outputs a _-bit duty_div2[3:0] at 554, and any remainder bit, REM, at 556, a sum of which corresponds to TEM delay 622 in FIG. 6.

Control logic 530 further includes subtraction logic 558 to subtract duty_div2[3:0] from ½ of the maximum value of duty[4:0] (i.e., $2^M/2=2^{(M-1)}$), and output the result as sub[3:0] at 560. This corresponds to LEM delay 620 in FIG. 6.

Logic to generate cLEM 532 and cTEM 534 is now described.

Regarding cLEM 532, control logic 530 includes comparator logic 562 to output an indication 564 when the LSBs of Count[2:0], illustrated here as Count[1:0], equals sub[3:2], corresponding to LEM MSB delay 619.

Control logic 530 further includes AND logic 566 to output indication 564 as cLEM 532 when the MSB of Clock[2:0], illustrated here as Clock[2] is low, which corresponds to LEM cycle 626 in FIG. 6.

Regarding cTEM 534, control logic 530 includes comparator logic 568 to output an indication 570 when the Count[1:0]=duty_div2[3:2], corresponding to TEM MSB delay 621.

Control logic 530 further includes AND logic 572 to output indication 570 as cTEM 532 when Clock[2] is high, which corresponds to TEM cycle 628 in FIG. 6.

Logic to generate phase select 528, or ph_sel[1:0], is now described.

Control logic 530 is implemented to provide LSBs of sub[3:0], illustrated here as sub[1:0], corresponding to LEM LSB delay 623, as a LEM phase select 574.

Control logic 530 includes summation logic 578 to sum LSBs of duty_div2[3:0], illustrated here as duty_div2[1:0], corresponding to TEM LSB delay 625, with REM 556, to generate a TEM phase select 576.

Control logic 530 further includes multiplexer logic 546 to output LEM phase select 574 as phase select 528 during LEM cycle 626, and TEM phase select 576 during TEM cycle 626.

A summary of control values for the example of duty[4:0]=01101 are provided in Table 1.

TABLE 1

| Reference | Value | Selected Phase |
|---|---|---|
| duty[4:0] = | 01101 | |
| duty[4:0]/2 = duty_div2[3:0] = | 0110 | |
| REM = | 1 | |
| TEM MSB Delay 621 = duty_div2[3:2] = | 01 | |
| TEM Phase Select 576 = duty_div2[1:0] + REM = 10 + 1 = | 11 | Phase 504-2 |
| LEM Delay 620 = sub[3:0] = 1111 − 0110 = | 1001 | |
| LEM MSB Delay 619 = sub[3:2] = | 10 | |
| LEM Phase Select 574 = sub[1:0] = | 01 | Phase 504-0 |

Pulse circuitry 536 is now described.

During LEM cycle 626, cLT 542 becomes active when cLEM 532 is active. D flip-flop 540 registers a leading edge 616 of cLT 542 as leading edge 608 of pulse 602 upon a leading edge of selected phase 522, which is selected based on LEM phase select 574. D flip-flop 540 thus delays leading edge 616 of cLT 542 by selected phase 522. In the example of FIG. 6, leading edge 616 is delayed until a leading edge 630 of phase 504-0.

After D flip-flop 540 registers leading edge 616, cLT 542 is maintained active with feedback from PWM signal 510 until a leading edge 614 of cTEM 534.

During TEM cycle 628, D flip-flop 540 registers a trailing edge 618 of cLT 542 as trailing edge 612 of pulse 602 upon a leading edge of selected phase 522, which is selected based on TEM phase select 576. In the example of FIG. 6, trailing edge 618 is delayed until a leading edge 632 of phase 504-2.

Figure 7:
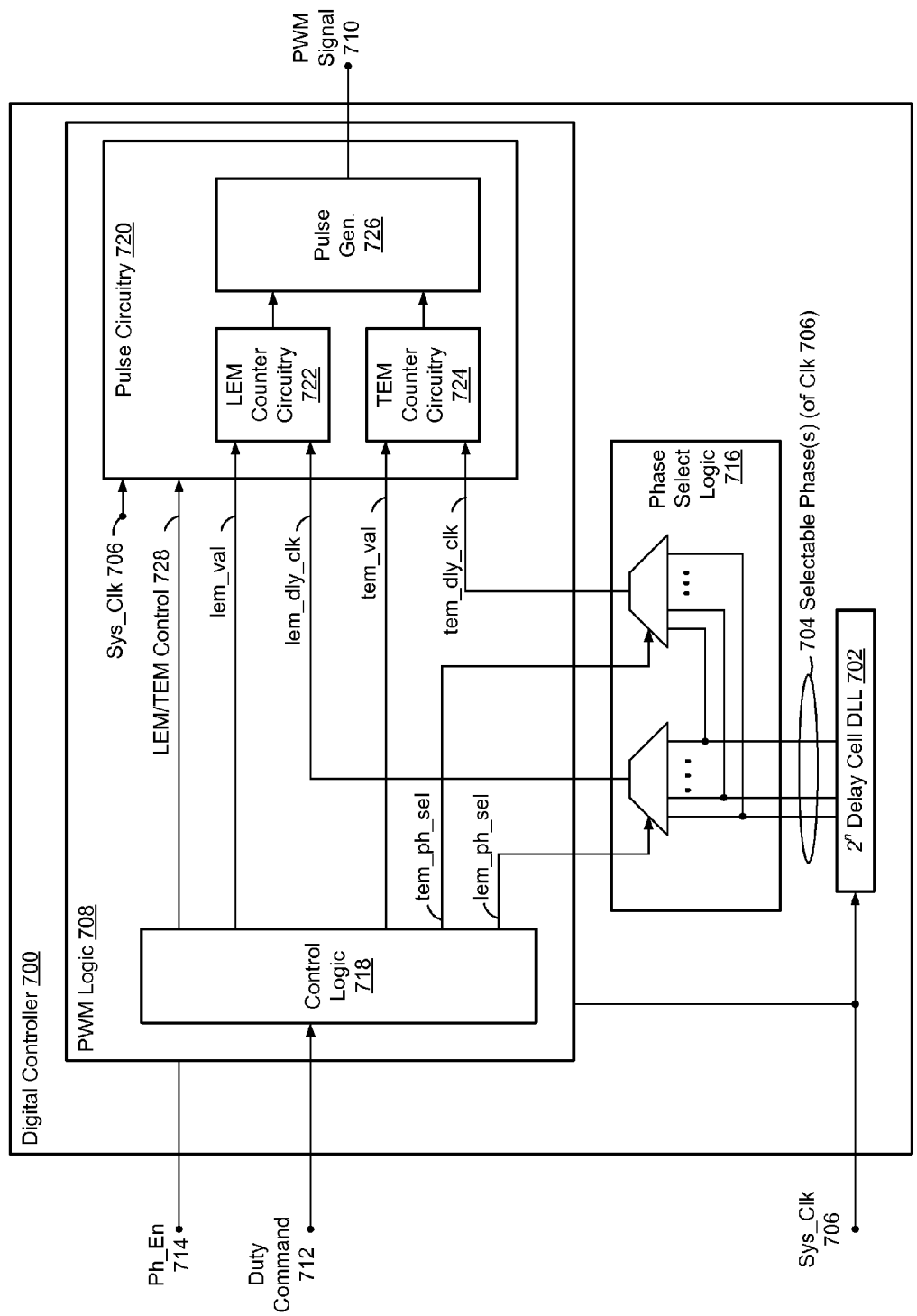
FIG. 7 is a block diagram of a controller to generate a PWM pulse within a clock domain defined by a selectable phase of a system clock, such that a leading and/or trailing edge of the clock is synchronous with the clock domain.

FIG. 7 is a block diagram of a controller 700 to generate a PWM pulse within a clock domain defined by a selectable phase of a system clock Sys_Clk 706, such that a leading and/or trailing edge of the clock is synchronous with the clock domain.

Controller 700 may include a DLL 702 to generate multiple phases 704 of Sys_Clk 706. In FIG. 7, DLL 702 includes $N=2^n$ delay cells, which may be denoted 0, 1, ... n.

Controller 700 further includes phase select logic 716 to output one or more phases of Sys_Clk 706. In the example of FIG. 7, phase select logic 716 includes logic to provide a first phase of Sys_Clk 706 as a lem_dly_clk, and a second phase of Sys_Clk 706 as a tem_dly_clk. Clocks lem_dly_clk and tem_dly_clk may define corresponding LEM and TEM clock domains within which to generate leading and trailing edges of a pulse.

Controller 700 further includes PWM logic 708 to generate a PWM signal 710 based on a duty command 712, Sys_Clk 706, lem_dly_clk, and tem_dly_clk.

PWM logic 708 may include control logic 718 to generate controls and/or delay terms based on duty command 712 and system clock 706. In FIG. 7, control logic 718 is implemented to generate a lem_ph_sel and a tem_ph_sel to control selection of phases 704 for lem_dly_clk and tem_dly_clk. Control logic 718 may be implemented to generate lem_ph_sel based on LSBs of duration 212 in FIG. 2, and to generate tem_ph_sel based on LSBs of duration 222 in FIG. 2.

Control logic 718 may be implemented to provide a LEM/TEM control 728 to define or distinguish between LEM and TEM cycles 226 and 228 in FIG. 2. LEM/TEM control 728 may correspond to a count of Sys_Clk 706, such as described below with reference to FIGS. 8 and 9.

Control logic 718 may be implemented to provide a target LEM count, lem_val, which may be based on MSBs of duration 212 in FIG. 2. Control logic 718 may be further implemented to provide a target TEM count, tem_val, which may be based on MSBs of duration 222 in FIG. 2.

PWM logic 708 may include pulse circuitry 720 to generate a PWM pulse.

Pulse circuitry 720 may include LEM counter logic 722 to generate a leading pulse edge within a LEM clock domain defined by lem_dly_clk.

Pulse circuitry 720 may further include TEM counter logic 724 to control a trailing pulse edge within respect to a TEM clock domain defined by tem_dly_clk.

Pulse circuitry 720 may further include a pulse generator 726 to construct a PWM pulse based on leading and trailing edge outputs of LEM counter logic 722 and TEM counter logic 724.

LEM counter logic 722 may be implemented to increment a LEM count based on lem_dly_clk, and output a leading edge decision when the LEM count reaches lem_val. Similarly, TEM counter logic 724 may be implemented to increment a TEM count based on lem_dly_clk, and output a trailing edge decision when the TEM count reaches tem_val.

Controller 700 may be implemented as described below with reference to one or more of FIGS. 8, 9, and 10.

Figure 8:
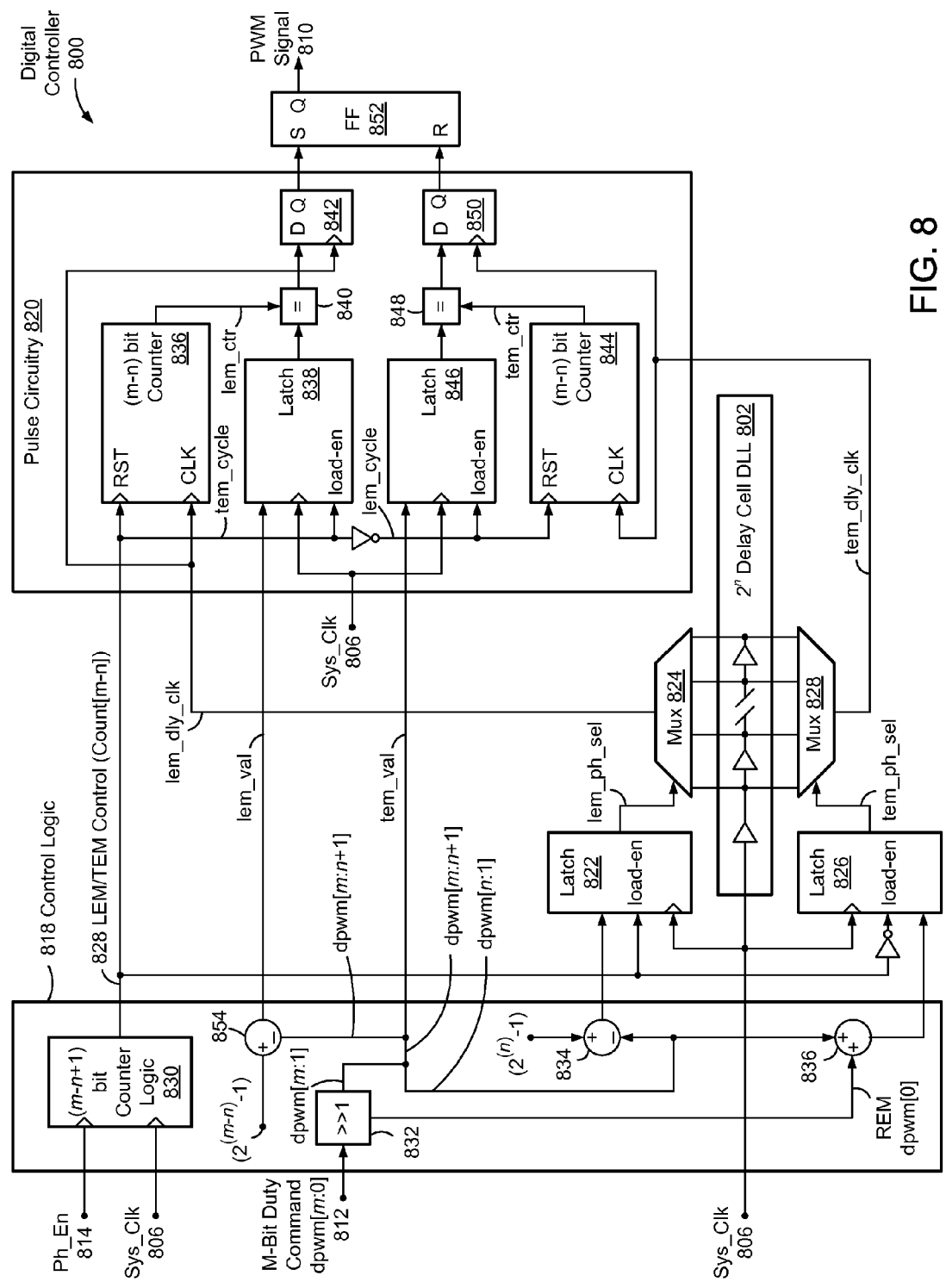
FIG. 8 is a block diagram of a controller 800 to generate leading and trailing edges of a PWM pulse, each within a corresponding clock domain defined by a selectable phase of a system clock, such that the leading and trailing edges are synchronous with the corresponding clock domains.

FIG. 8 is a block diagram of a controller 800 to generate leading and trailing edges of a PWM pulse, each within a corresponding clock domain defined by a selectable phase of a system clock 806, such that the leading and trailing edges are synchronous with the corresponding clock domains.

Controller 800 includes PWM logic, illustrated here as including control logic 818 and pulse circuitry 820, to generate a PWM signal 810 based on a duty command 812, Sys_Clk 806, and selectable phases of Sys_Clk 806.

In the example of FIG. 8, duty command 812 is illustrated as an M-bit duty command, dpwm[m:0], where M=(m+1). Controller 800 is described below with reference to FIG. 9, and with respect to a 5-bit duty command 812, dpwm[4:0]= 01101, and with respect to a 4-delay cell DLL 802 (i.e., m=4, M=m+1=5, n=2, and N=4).

Figure 9:
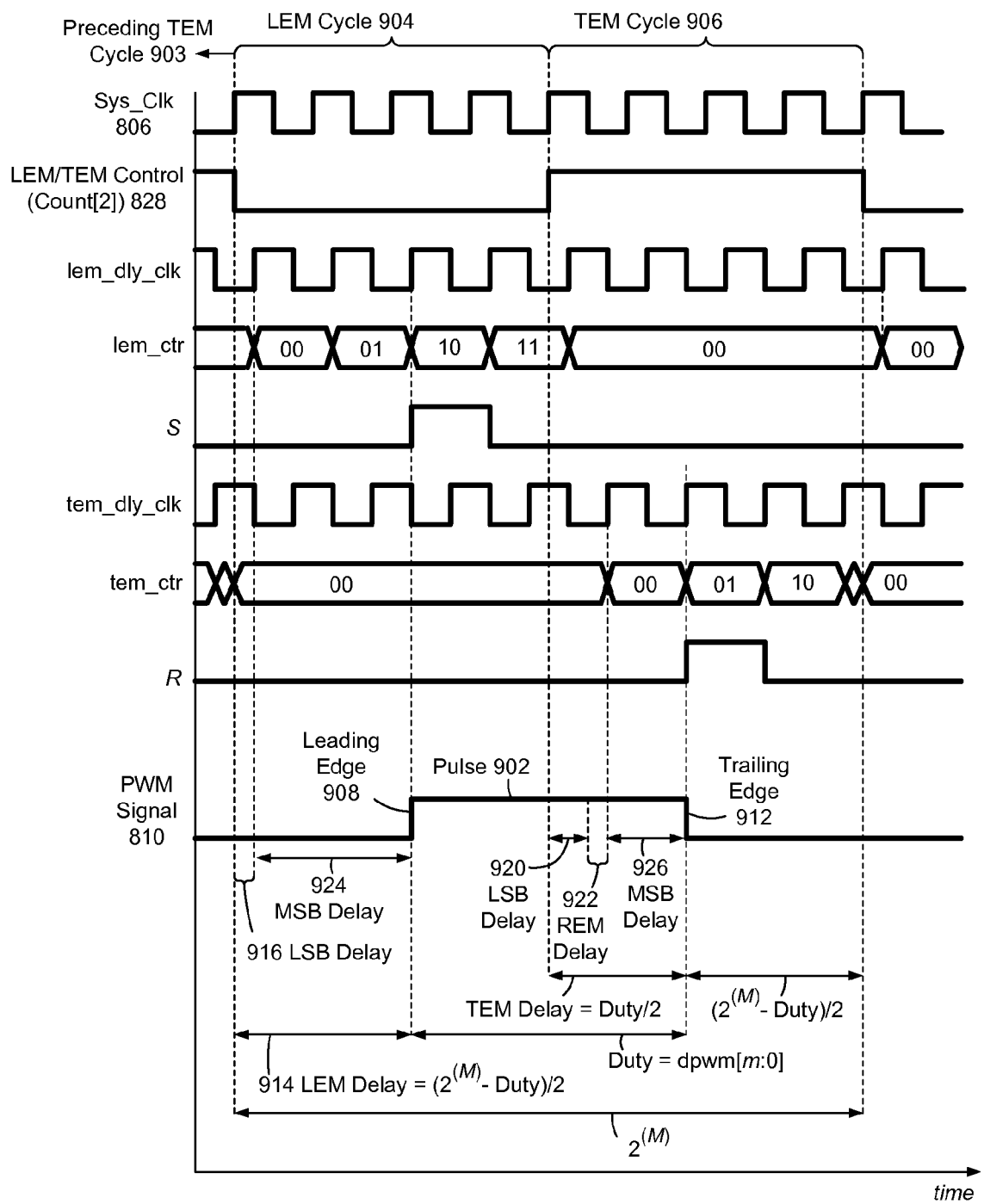
FIG. 9 is a timing diagram described below with reference to FIG. 8.

FIG. 9 is a timing diagram 900 described below with reference to FIG. 8. Timing diagram 900 is not, however, limited to the example of FIG. 8.

In FIG. 9, PWM signal 810 includes a pulse 902, having a leading edge 908 and a trailing edge 912, and centered within a LEM cycle 904 and a TEM cycle 906.

In FIG. 8, controller 800 further includes a DLL 802 to generate multiple phases of Sys_Clk 806. In FIG. 8, DLL 802 is illustrated as having $2^n$ delay cells.

Controller 800 further includes phase select logic to output selected phases of Sys_Clk 806 to pulse circuitry 820 as lem_dly_clk and tem_dly_clk. As described above with respect to FIG. 7, lem_dly_clk and tem_dly_clk define corresponding LEM and TEM clock domains.

The phase select logic includes a latch 822 to register lem_ph_sel to multiplex logic 824, and a latch 826 to register tem_ph_sel to multiplex logic 828, on leading edges of Sys_Clk 806. Latch 822 may be enabled during LEM cycle 904, and latach 826 may be enabled during TEM cycle 906.

Multiplex logic 824 outputs a selected phase of Sys_Clk 806 as a lem_dly_clk, based on lem_ph_sel. Multiplex logic 828 outputs a selected phase of Sys_Clk 806 as a tem_dly_clk based on tem_ph_sel.

Lem_ph_sel may correspond to a LSB delay 916 portion of a LEM delay 914 in FIG. 9. LEM delay 914 may be expressed as :

$$\text{LEM Delay 914} = \frac{(2^{(m+1)} - dpwm[m:0])}{2}. \qquad \text{EQ. (6)}$$

In FIG. 8, control logic 818 includes logic 832 to right-shift duty command 812, which is equivalent to dividing duty command 812 by 2 (i.e., dpwm[m:0]/2). Logic 832 provides right-shifted bits as dpwm[m:1], and any remainder, or REM, as dpwm[0].

Control logic 818 further includes logic 834 to subtract LSBs of dpwm[m:1], illustrated here as dpwm[n:1], from ½ of the maximum value of the LSBs, illustrated here as $2^{(n)}-1$. Logic 834 thus outputs lem_ph_sel as the LSBs of EQ. (6).

Tem_ph_sel may correspond a sum of a MSB delay 926 and a REM delay 922 in FIG. 9, which may be determined as a sum of LSBs ½ (duty command 812), and any remainder. As described above, control logic 818 includes right-shift logic 832 to divide duty command 812, dpwm[m:0], by 2. Control logic 818 further includes logic 836 to sum LSBs dpwm[n:1], of right-shifted bits dpwm[m:1], and remainder dpwm[0], to generate tem_ph_sel.

In the example of FIG. 9, for a duty command 812 of dpwm[4:0]=01101, logic 832 outputs dpwm[m:1]=0110, with REM=dpwm[0]=1.

Logic 834 subtracts the two LSBs of dpwm[m:1] (i.e., dpwm[n:1]=10), from the maximum LSB value of 11, to determine lem_ph_sel as 11−10=01, which corresponds to a first delay cell of DLL 802, referred to herein as c0.

In FIG. 9, lem_dly_clk has 1-cell phase delay relative to Sys_Clk 806, which corresponds to LSB delay 916 of LEM delay 914. In this example, the 1-cell phase delay corresponds to a 90 degree phase shift relative to Sys_Clk 806.

Further regarding the example of FIG. 9, logic 836 sums the two LSBs of dpwm[m:1] (i.e., dpwm[n:1]=10]), and remainder REM dpwm[0]=1, to determine tem_ph_sel as 10+1=11, which corresponds to a third delay cell of DLL 802, referred to herein as c2.

In FIG. 9, tem_dly_clk has a 3-cell phase delay relative to Sys_Clk 806, which corresponds to LSB delay 920 and remainder 922. In this example, the 3-cell phase delay corresponds to a 270 degree phase shift relative to Sys_Clk 806, and a 180 degree phase difference with respect to to lem_dly_clk.

In FIG. 8, control logic 818 includes a counter to generate a LEM/TEM control 828 based on a count of Sys_Clk 806. LEM/TEM control 828 may be used to distinguish between LEM cycle 904 and TEM cycle 906 in FIG. 9.

Control logic 818 further includes logic to generate lem_val and tem_val, which may represent target counts for LEM cycle 604 and TEM cycle 606, respectively.

As illustrated in FIG. 9, lem_val may represent MSB delay 924 of delay 914. In FIG. 8, control logic 818 includes right-shift logic 832 and logic 854 to derive lem_val from duty command 812.

As described above, right-shift logic 832 provides ½ (dpwm[m:0]) as dpwm[m:1] and remainder bit REM, dpwm[0]. Logic 854 subtracts the two MSBs of dpwm[m:1] (i.e., dpwm[m:n+1], from the maximum value of the two MSBs (i.e., $2^{(m-n)}-1$). In the example of FIG. 9, where dpwm[m:0]=01101, logic 854 determines lem_val as:

$$(2^{m-n}-1)-\text{dpwm}[m:n+1]=11-01=10.$$

As further illustrated in FIG. 9, tem_val may represent MSB delay 926, which may correspond to LSBs of ½ (duty command 812). In FIG. 8, as described above, control logic 818 includes right-shift logic 832 to provide ½ (dpwm[m:0]) as dpwm[m:1] and remainder bit REM, dpwm[0]. MSBs of dpwm[m:1] (i.e dpwm[m:n+1]), are provided to latch 846 as tem_val. In the example of FIG. 9, where dpwm[m:0]=01101, tem_val=dpwm[m:n+1]=01.

Pulse circuitry 820 is now described.

In FIG. 8, pulse circuitry 820 includes a latch 838 to receive and register LEM reference value lem_val, from control logic 818, a counter 836 to count leading edges of lem_dly_clk as lem_ctr, and comparator logic 840 to compare lem_ctr to lem_val. Pulse circuitry 820 further includes a D flip-flop 842 to register an output of comparator logic 840 to a set input of a set/reset (SR) flip-flop 852, upon a leading edge of lem_dly_clk.

Similarly, pulse circuitry 820 includes a latch 846 to receive and register TEM reference value tem_val, from control logic 818, a counter 844 to count leading edges of tem_dly_clk as tem_ctr, and comparator logic 848 to compare tem_ctr to tem_val. Pulse circuitry 820 further includes a D flip-flop 850 to register an output of comparator logic 848 to a reset input of SR flip-flop 852, upon a leading edge of tem_dly_clk.

SR flip-flop 852 outputs pulse 902, beginning with leading edge 908 of pulse 902 upon receipt of a set input from D flip-flop 842. SR flip-flop 852 terminates pulse 902 with trailing edge 912 upon receipt of a reset input from D flip-flop 850.

Where an updated lem_val is registered during LEM cycle 904, and where the updated lem_val is less than a current count of lem_ctr, comparator logic 840 may not properly set SR flip-flop 850. To prevent such a situation, latch 838 may be implemented to register lem_val during a preceding TEM cycle 903, and may be disabled during TEM cycle 904. Similarly, latch 846 may be implemented to register tem_val during LEM cycle 904, and may be disabled during TEM cycle 906. This may also conserve power. For example, in FIG. 8, latch 838 is disabled by LEM/TEM control 828 (e.g., Count[2]), during LEM time 904 in FIG. 9. Similarly latch 846 is disabled by LEM/TEM control 828 during TEM time 906.

Alternatively, pulse circuitry 820 may include circuitry to permit updating of lem_val during LEM time 904, and/or tem_val during TEM time 906, provided that the updated value is greater than a current count value, such as described below with reference to FIG. 10.

Figure 10:
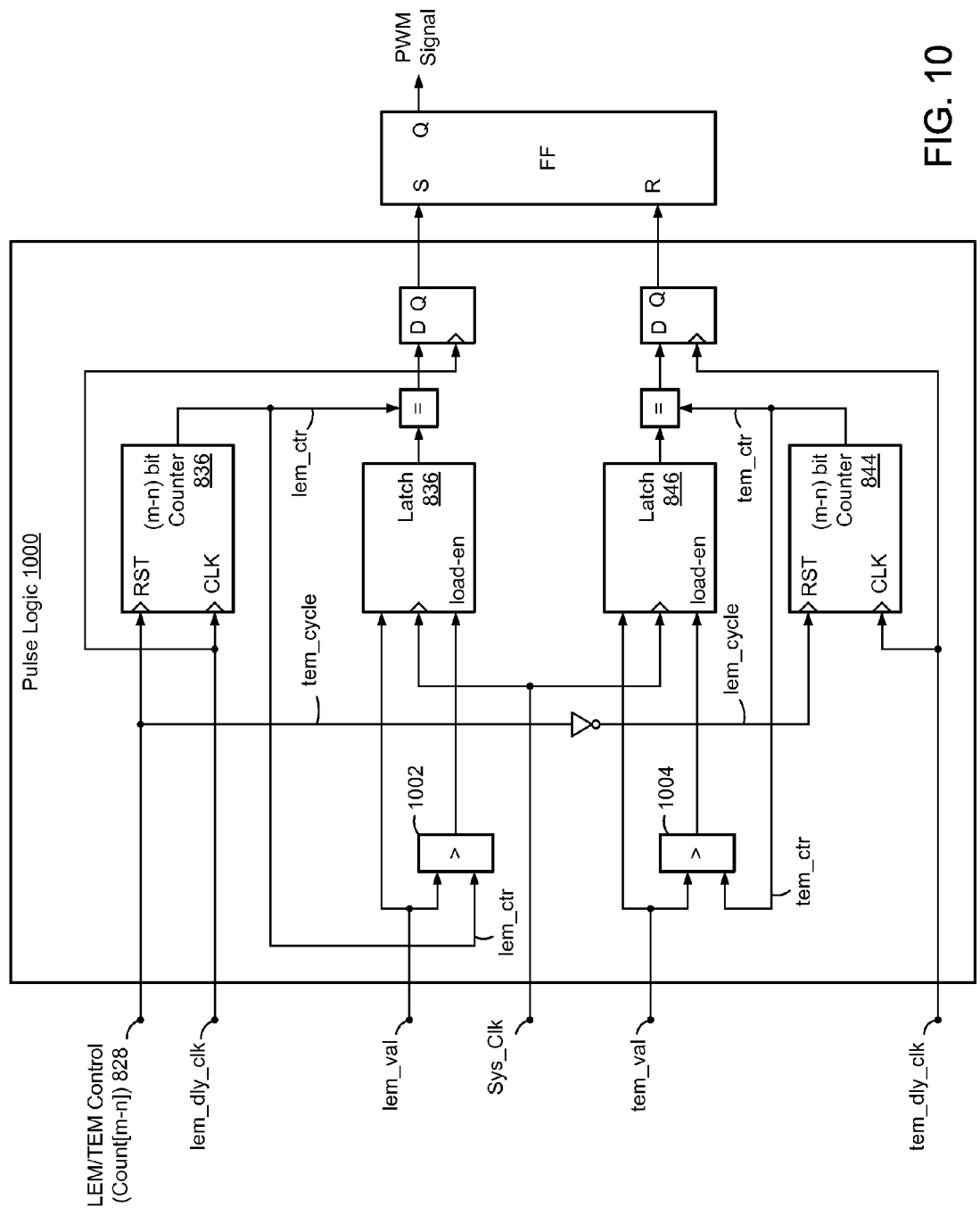
FIG. 10 is a block diagram of pulse circuitry, including features described below with reference to FIG. 8.

FIG. 10 is a block diagram of pulse circuitry 1000, including features described above with reference to FIG. 8.

Pulse circuitry 1000 further includes comparator logic 1002 to enable latch 836 to latch lem_val, when lem_val is greater than lem_ctr.

Similarly, pulse circuitry 1000 includes comparator logic 1004 to enable latch 846 to latch tem_val, when tem_val is greater than tem_ctr.

Comparator logic 1002 may include threshold logic to preclude enabling of latch 836 unless the new lem_val is greater than lem_ctr by a threshold amount. This may help to provide sufficient time to register lem_val before lem_ctr potentially increments beyond the new lem_val. Comparator logic 1004 may include similar threshold logic.

In FIGS. 8 and 10, registering of leading and trailing edges 908 and 912 with D flip-flops 842, based on lem_dly_clk and tem_dly_clk, may help to avoid glitches at the S and R inputs of SR flip-flop 852.

Further regarding FIGS. 8 and 10, LEM counter 836 and comparator logic 840 may be disabled during TEM cycle 906, and TEM counter 844 and comparator logic 848 may be disabled during LEM cycle 904. In this way, pulse circuitry 802 implements dual-edge modulation using a single active clock domain at any given time, rather than relying on multiple simultaneous clock domains that might otherwise necessitate double synchronization. This may also conserve power.

In addition, leading edge 908 is generated synchronously within LEM clock domain lem_dly_clk, and trailing edge 912 is generated synchronously within TEM clock domain tem_dly_clk. These features, in combination with registering of leading and trailing edges 908 and 912 with D flip-flop 842 and 850 based on the corresponding LEM and TEM clock domains, provides a synchronous design.

Pulse 902 may thus be generated with a hybrid digital controller (i.e., includes a counter and a DLL), without asynchronous logic, which may provide a suitable balance between power and area consumption, and ease of implementation. Moreover, such a hybrid digital controller may be used to generate PWM signals for multiple VRs and/or multiple phases of a multi-phase VR from a shared DLL.

The synchronous nature of a hybrid digital controller, as described above with reference to one or more of FIGS. 7 through 10, may provide substantially uniform and monotonic PWM pulses, even with variations in duty command, without intensive verification and validation, and without necessitating custom layout. Such a hybrid digital controller may be designed at a register-transfer level (RTL) of abstraction that is "correct by construction," and that provides monotonic pulse generation independent of a process node.

Figure 11:
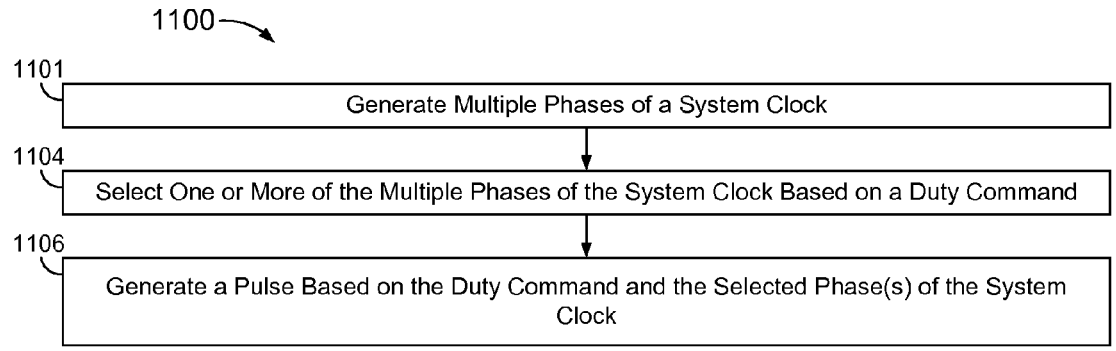
FIG. 11 is a flowchart of a method of generating a pulse width modulated (PWM) signal based on a duty command and selectable phases of a system clock.

FIG. 11 is a flowchart of a method 1100 of generating a pulse width modulated (PWM) signal 104 based on a duty command and selectable phases of a system clock. Method 1100 may be implemented with one or more features described above with reference to one or more of FIGS. 1 through 10. Method 1100 is not, however, limited to any of the examples of FIGS. 1 through 10.

At 1102, multiple phases of a system clock are generated. The phases of the system clock may be generated with a DLL, such as described in examples above.

At 1102, one of the phases of the system clock is selected based on a duty command. The duty command may be generated by a duty command controller based on the system clock. The phase of the system clock may be selected based on a delay term derived from the duty command.

At 1104, a pulse is generated based on the duty command and the selected phase of the system clock. Pulse generation may include generating an initial pulse based on a delay term derived from the duty command, using combinational logic, and re-timing the initial pulse based on the selected phase of the system clock. Alternatively, the selected phase of the system clock may be used to generate the pulse directly, based on a count of the system clock relative to a target count derived from the duty command.

Method 1100 may be implemented to generate multiple PWM signals from a shared set of phases of a system clock, such as to control multiple voltage regulators and/or multiple phases of a multi-phase voltage regulator.

Figure 12:
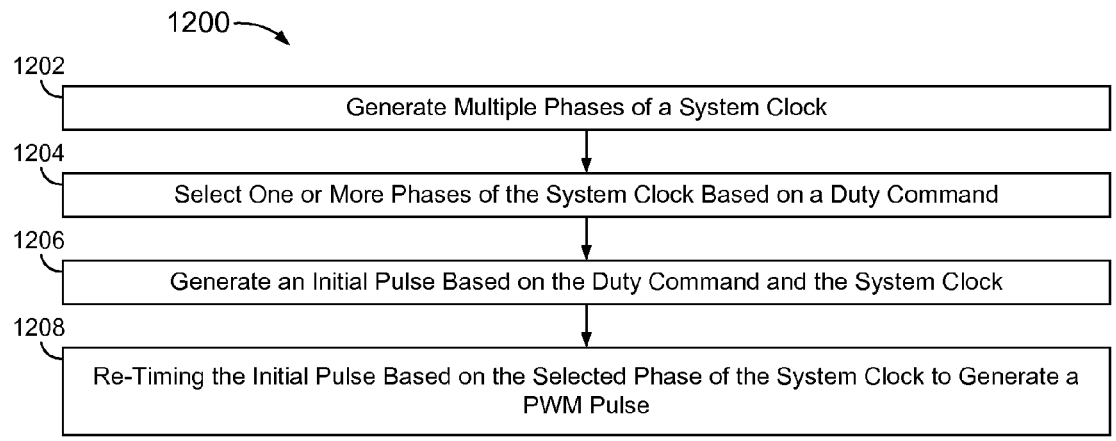
FIG. 12 is a flowchart of a method of generating an initial pulse based on a delay term derived from a duty command, and re-timing the pulse based on a selected phase of a system clock.

FIG. 12 is a flowchart of a method 1200 of generating an initial pulse based on a delay term derived from a duty command, and re-timing the pulse based on a selected phase of a system clock. Method 1200 may be implemented with one or more features described above with reference to one or more of FIGS. 1 through 6. Method 1200 is not, however, limited to any of the examples of FIGS. 1 through 6.

At 1202, multiple phases of a system clock are generated, such as described above with reference to 1102 in FIG. 11.

At 1204, one of the phases of the system clock is selected based on a duty command, such as described above with reference to 1104 in FIG. 11. The selecting may include selecting a first one of the phases as LEM clock and/or selecting a second one of the phases as a TEM clock At 1206, an initial pulse is generated based on the duty command and the system clock. The initial pulse may be generated based on one or more of a LEM delay term and a TEM delay term derived from the duty command, such as with combinational logic.

At 1208, the initial pulse is re-timed based on the selected phase of the system clock to generate a PWM pulse. The re-timing may include registering a leading edge of the initial pulse based on a leading edge of a LEM clock, and/or registering a trailing edge of the initial pulse based on a leading edge of a TEM clock. The registering may include registering with a D flip-flop.

Figure 13:
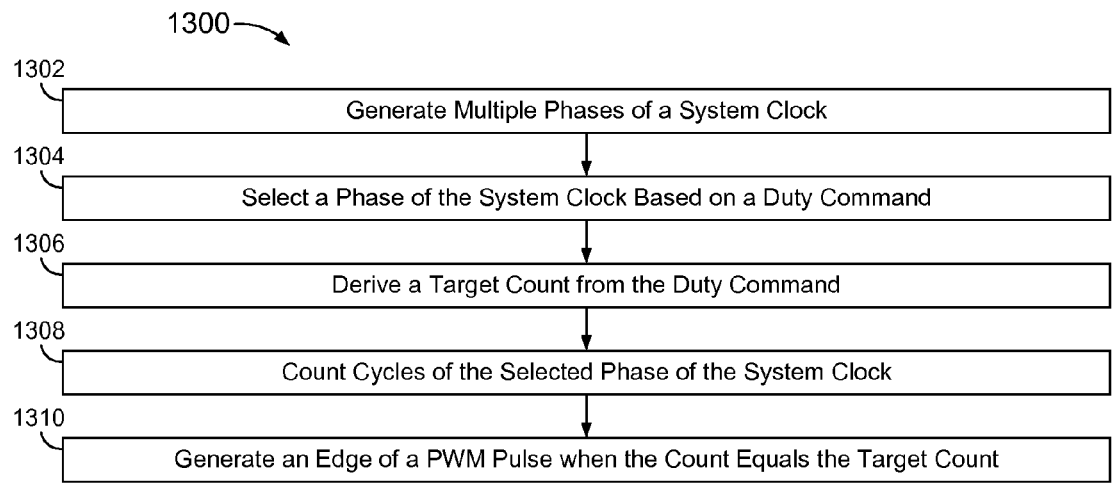
FIG. 13 is a flowchart of a method of generating a pulse within a clock domain defined by selectable phase of a system clock, such that a leading and/or trailing edge of the pulse is synchronous with the clock domain.

FIG. 13 is a flowchart of a method 1300 of generating a pulse within a clock domain defined by selectable phase of a system clock, such that a leading and/or trailing edge of the pulse is synchronous with the clock domain. Method 1300 may be implemented with one or more features described above with reference to one or more of FIGS. 1 through 3 and 7 through 10. Method 1300 is not, however, limited to any of the examples of FIGS. 1 through 3 and 7 through 10.

At 1302, multiple phases of a system clock are generated, such as described above with reference to 1102 in FIG. 11.

At 1304, one of the phases of the system clock is selected based on a duty command, such as described above with reference to 1104 in FIG. 11. The selecting may include selecting a first one of the phases as LEM clock and selecting a second one of the phases as a TEM clock, based on corresponding LEM and TEM delay terms derived from the duty command.

At 1306, a target count is derived from the duty command. The deriving may include deriving a LEM target count and a TEM target count from the duty command.

At 1308, cycles of the selected phase are counted. The counting may include incrementing a LEM count based on a LEM clock and incrementing a TEM count based on a TEM clock. The incrementing may be performed during corresponding LEM and TEM cycles.

At 1310, an edge of a pulse is generated or output, when the count equals the target count. Where an LEM count and a TEM count are maintained, the generating may include generating a leading edge of the pulse when the LEM count equals the LEM target count, and a trailing edge of the pulse when the TEM count equals the TEM target count, such as described above with reference to one or more of FIGS. 7 through 10.

The edge may be registered with a D flip-flop based on the selected phase of the system clock. Where leading and trailing edges are generated within corresponding LEM and TEM clock domains, outputs of corresponding D flip-flops may be presented to set and reset inputs of a SR flip-flop, such as described further above.

Methods and systems disclosed herein may be implemented to regulate one or more power domains of an integrated circuit die, such as described below with reference to FIG. 14.

Figure 14:
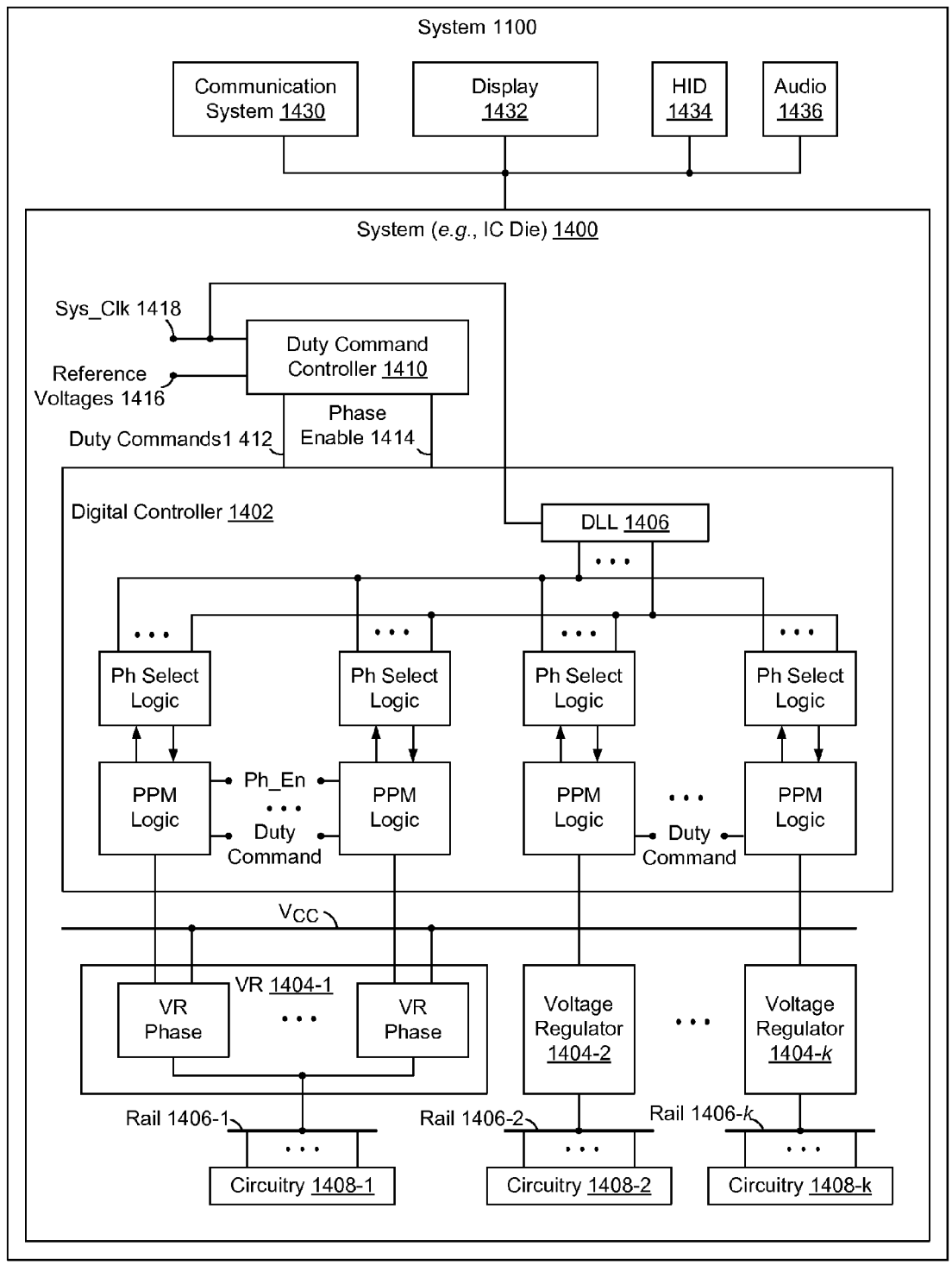
FIG. 14 is a block diagram of a system including a hybrid digital controller to control multiple voltage regulators.

FIG. 14 is a block diagram of a system 1400 including a hybrid digital controller 1402 having a DLL 1406 to generate multiple phases of a system clock 1418 to control multiple voltage regulators (VRs) 1404, such as described in one or more examples above.

VRs 1404 may be implemented to regulate voltages at corresponding voltage rails 1406 to power corresponding circuitry 1408.

System 1400 may implemented within an integrated circuit (IC) die, and circuitry 1408-1 through 1408-$k$ may include one or more processors, processor cores, graphics processors, graphics processor elements, and/or portions thereof.

System 1400 may include a duty command controller 1410 to provide duty commands 1412 to PPM logic of digital controller 1402 based on corresponding reference voltages 1416 and system clock 1418. Duty command controller 1410 may be implemented to provide phase enable controls 1414 to control PMM logic of a multi-phase VR, such as VR 1404-1.

Figure 15:
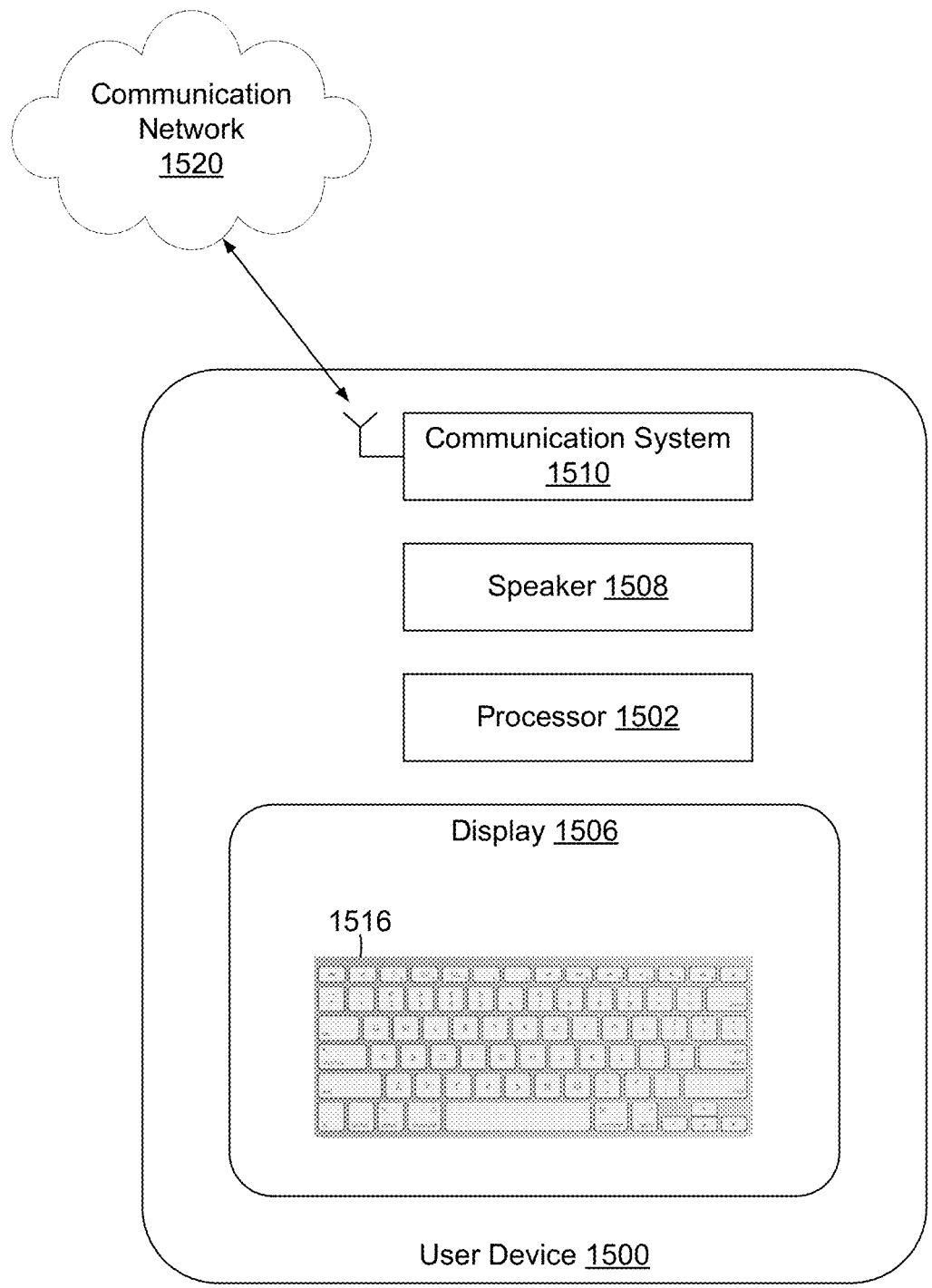
FIG. 15 is an illustration of a user device.

FIG. 15 is an illustration of a user device 1500 that includes a processor 1502 and a communication system 1510 to interface between processor 1502 and a communication network 1520. Communication system 1510 may include a wired and/or wireless communication system.

User device 1500 further includes a monitor or display 1506 to display information from the processor.

User device 1500 may further include a human interface device (HID) to provide user input to the processor. The HID may include, for example and without limitation, one or more of a key board 1516, a cursor device, a touch-sensitive device, and or a motion and/or image sensor. The HID may include a physical device and/or a virtual device, such as a monitor-displayed or virtual keyboard.

User device 1500 may further include an audio system, illustrated here as including a speaker 1508, to provide an audible output from the processor and/or communication system 1510.

User device 1500 may be battery powered.

One or more of communication system 1510, display 1506, speaker 1508 may receive power from one or more of regulated voltage rails, such as described in one or more examples herein.

Users device 1500 further includes a housing 1530. The housing may include, without limitation, a rack-mountable housing, a desk-top housing, a lap-top housing, a notebook housing, a net-book housing, a set-top box housing, a hand-held housing, and/or other conventional electronic housing and/or future-developed housing. System 1400 may correspond to, without limitation, a computer system, a server system, and/or a hand-held processor and/or communication device.

Methods and systems are disclosed herein with the aid of functional building blocks illustrating functions, features, and relationships thereof. At least some of the boundaries of these functional building blocks have been arbitrarily defined herein for the convenience of the description. Alternate boundaries may be defined so long as the specified functions and relationships thereof are appropriately performed.

While various embodiments are disclosed herein, it should be understood that they have been presented by way of example only, and not limitation. It will be apparent to persons skilled in the relevant art that various changes in form and detail may be made therein without departing from the spirit and scope of the methods and systems disclosed herein. Thus, the breadth and scope of the claims should not be limited by any of the example embodiments disclosed herein.

What is claimed is:

1. An apparatus, comprising, a first pulse width modulator and a controller to provide a first digital duty command to the first pulse width modulator, wherein the first digital duty command specifies a duty to within a fraction of a cycle of a system clock to the first pulse width modulator, and wherein the first pulse width modulator is configured to:
   generate a first digital delay value based on a value of the first digital duty command and a maximum value of the first digital duty command;
   assert an edge of a pulse based on most significant bits of the first digital delay value;
   select a first one of multiple phases of the system clock based on least significant bits of the first digital delay value; and
   re-time the edge of the pulse based on the first selected phase of the system clock to adjust a width of the pulse.

2. The apparatus of claim 1, further including:
   a second pulse width modulator configured identical to the first pulse width modulator, wherein the controller is further configured to provide a second digital duty command to the second pulse width modulator; and
   a delay locked loop to provide the multiple phases of the system clock to each of the first and second pulse width modulators.

3. The apparatus of claim 2, further including first and second voltage regulators, wherein:
   the first pulse width modulator is configured to control the first voltage regulator; and
   the second pulse width modulator is configured to control the second voltage regulator.

4. The apparatus of claim 2, further including a multi-phase voltage regulator, wherein:
   the first pulse width modulator is configured to control a first phase of the multi-phase voltage regulator;
   the second pulse width modulator is configured to control a second phase of the multi-phase voltage regulator; and
   the controller is further configured to selectively enable the first and second pulse width modulators.

5. The apparatus of claim 1, wherein the first pulse width modulator includes a register to re-time the edge of the pulse based on the first selected phase of the system clock.

6. The apparatus of claim 5, wherein the register includes:
   a D flip-flop to register the edge of the pulse under control of the selected phase of the system clock to re-time the edge of the pulse.

7. The apparatus of claim 1, wherein the first pulse width modulator is further configured to:
   generate the first digital delay value based on a difference between one-half the maximum value of the first digital duty command and one-half the value of the first digital duty command;
   assert a leading edge of the pulse based on the most significant bits of the first digital delay value; and
   re-time the leading edge of the pulse based on the first selected phase of the system clock to adjust the width of the pulse.

8. The apparatus of claim 7, wherein the first pulse width modulator is further configured to:
   generate a second digital delay value based on a sum of one-half the maximum value of the first digital duty command and one-half the first digital first digital duty command;
   assert a trailing edge of the pulse based on most significant bits of the second digital delay value;
   select a second one of the multiple phases of the system clock based on least significant bits of the second digital delay value; and
   re-time the trailing edge of the pulse based on the second selected phase of the system clock to adjust the width of the pulse.

9. The apparatus of claim 8, wherein the first pulse width modulator includes:
   a first D flip-flop to register the leading edge of the pulse to a SET input of a SR flip-flop under control of the first selected phase of the system clock to re-time the leading edge of the pulse; and
   a second D flip-flop to register the trailing edge of the pulse to a RESET input of the SR flip-flop under control of the second select phase of the system clock to re-time the trailing edge of the pulse.

10. The apparatus of claim 1, wherein the first pulse width modulator is further configured do:
   generate the first digital delay value based on a sum of one-half the maximum value of the first digital duty command and one-half the first digital first digital duty command;
   assert a trailing edge of the pulse based on the most significant bits of the first digital delay value; and
   re-time the trailing edge of the pulse based on the first selected phase of the system clock.

11. The apparatus of claim 1, wherein the first pulse width modulator is further configured to:
increment a count based on the first selected phase of the system clock; and
re-time the edge of the pulse when the count reaches the first digital delay value.

12. A system, comprising, and integrated circuit device that includes:
a voltage regulator to regulate a voltage of a first voltage rail;
first circuitry to receive power from the first voltage rail; and
a first pulse width modulator to control the voltage regulator; and
a controller to provide a first digital duty command to the first pulse width modulator, wherein the first digital duty command specifies a duty to within a fraction of a cycle of a system clock to the first pulse width modulator;
wherein the first pulse width modulator is configured to,
generate a first digital delay value based on a value of the first digital duty command and a maximum value of the first digital duty command;
assert an edge of a pulse based on most significant bits of the first digital delay value;
select a first one of multiple phases of the system clock based on least significant bits of the first digital delay value; and
re-time the edge of the pulse based on the first selected phase of the system clock to adjust a width of the pulse.

13. The system of claim 12, wherein the integrated circuit device includes a processor, further including:
a communication system to interface between the processor and a communication network;
a display to display information from the processor; and
a human interface device (HID) to provide user input to the processor.

14. The system of claim 12, wherein the integrated circuit device further includes:
a second pulse width modulator configured identical to the first pulse width modulator, wherein the controller is further configured to provide a second digital duty command to the second pulse width modulator; and
a delay locked loop to provide the multiple phases of the system clock to each of the first and second pulse width modulators.

15. The system of claim 14, wherein the integrated circuit device further includes:
a second voltage regulator to regulate a voltage of a second voltage rail;
second circuitry to receive power from the second voltage rail; and
wherein the second pulse width modulator is configured to control the second voltage regulator.

16. The system of claim 14, wherein the voltage regulator includes a multi-phase voltage regulator, and wherein:
the first width modulator is configured to control a first phase of the multi-phase voltage regulator;
the second pulse width modulator is configured to control a second phase of the multi-phase voltage regulator; and
the controller is further configured to selectively enable the first and second pulse width modulators.

* * * * *